United States Patent [19]

Gilardi

[11] Patent Number: 5,347,276

[45] Date of Patent: Sep. 13, 1994

[54] SERIAL BINARY PATTERN GENERATOR

[75] Inventor: Stephen C. Gilardi, Mystic, Conn.

[73] Assignee: TRW Inc., Redondo Beach, Calif.

[21] Appl. No.: 912,385

[22] Filed: Jul. 13, 1992

[51] Int. Cl.[5] .............................................. H03M 7/46
[52] U.S. Cl. ........................................ 341/59; 341/55
[58] Field of Search ..................... 341/59, 58, 51, 67, 341/55; 371/37.1, 47.1, 52; 364/717.5, 736

[56] References Cited

U.S. PATENT DOCUMENTS 3,647,964  3/1972  Tang ................................. 341/59
3,689,899  9/1972  Franaszek ......................... 341/59

Primary Examiner—Brian K. Young
Attorney, Agent, or Firm—Ronald L. Taylor

[57] ABSTRACT

The disclosed invention is a digitally configurable sequential logic circuit which produces serial binary data patterns. The circuit is configured by specifying two non-negative integers A and B. For given values of A and B, the circuit produces a serial binary data pattern with the following properties: 1) in every consecutive (A+B) bits of the pattern, there are A ones and B zeros, 2) the ones in the pattern are maximally spread apart from one another, and 3) the zeros in the pattern are maximally spread apart from one another. The patterns so produced are useful in a variety of applications.

21 Claims, 3 Drawing Sheets

Spreader Circuit Diagram

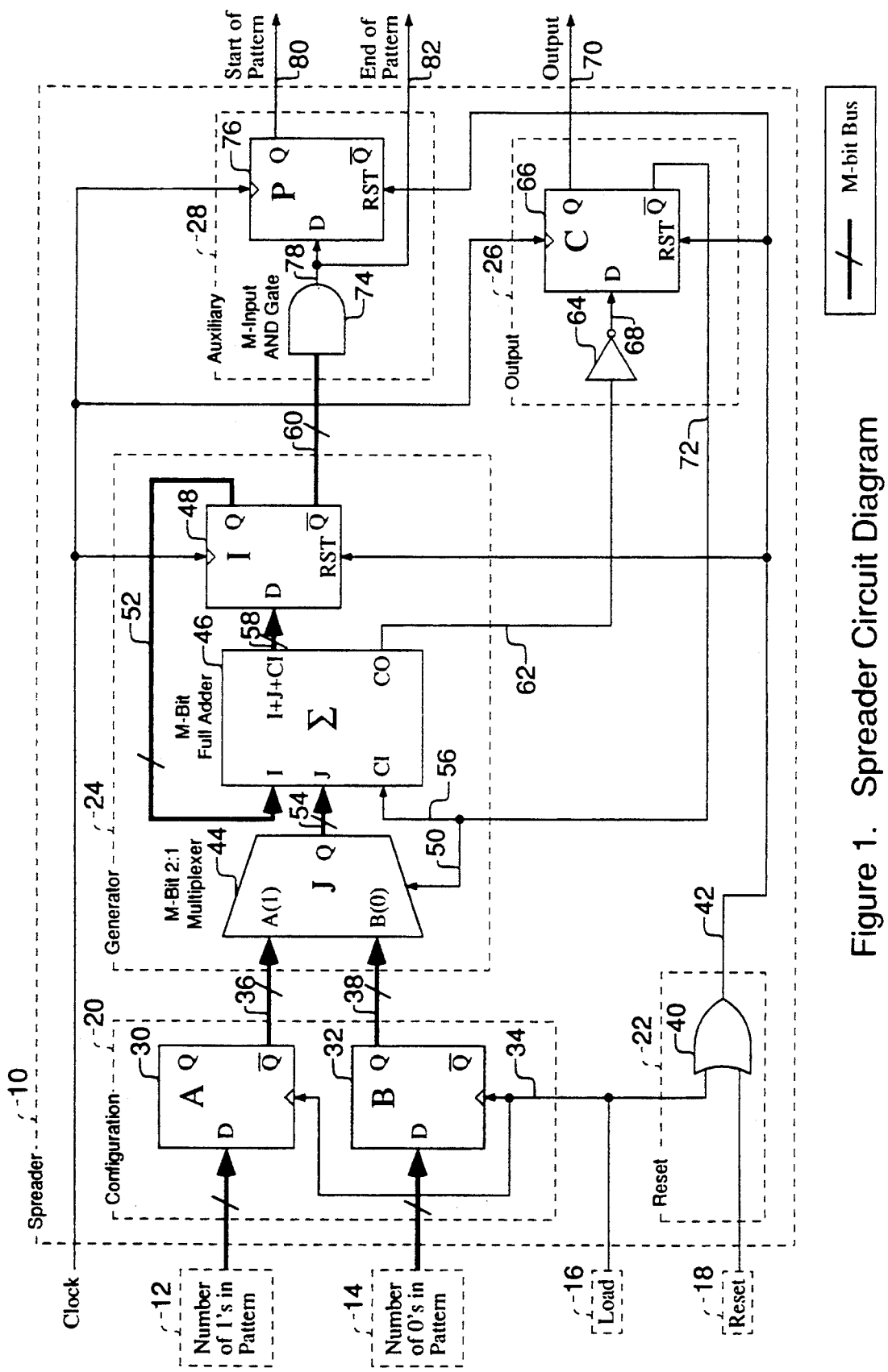
Figure 1. Spreader Circuit Diagram

| Integer Arithmetic (Decimal) | | | | Two's Complement Arithmetic (Hexadecimal) | | | | | Circuit Outputs | | |
|---|---|---|---|---|---|---|---|---|---|---|---|
| A | B | I | Delta | A-bar | B | I | J | Carry-in | Output | Start of Pattern | End of Pattern |
| 6 | 10 | 00 | -06 | F9 | 0A | 00 | F9 | 1 | 0 | 0 | 1 |
| 6 | 10 | -06 | +10 | F9 | 0A | FA | 0A | 0 | 1 | 1 | 0 |
| 6 | 10 | +04 | -06 | F9 | 0A | 04 | F9 | 1 | 0 | 0 | 0 |
| 6 | 10 | -02 | +10 | F9 | 0A | FE | 0A | 0 | 1 | 0 | 0 |
| 6 | 10 | +08 | -06 | F9 | 0A | 08 | F9 | 1 | 0 | 0 | 0 |
| 6 | 10 | +02 | -06 | F9 | 0A | 02 | F9 | 1 | 0 | 0 | 0 |
| 6 | 10 | -04 | +10 | F9 | 0A | FC | 0A | 0 | 1 | 1 | 0 |
| 6 | 10 | +06 | -06 | F9 | 0A | 06 | F9 | 1 | 0 | 0 | 0 |
| 6 | 10 | 00 | -06 | F9 | 0A | 00 | F9 | 1 | 0 | 0 | 1 |
| 6 | 10 | -06 | +10 | F9 | 0A | FA | 0A | 0 | 1 | 1 | 0 |
| 6 | 10 | +04 | -06 | F9 | 0A | 04 | F9 | 1 | 0 | 0 | 0 |
| 6 | 10 | -02 | +10 | F9 | 0A | FE | 0A | 0 | 1 | 0 | 0 |
| 6 | 10 | +08 | -06 | F9 | 0A | 08 | F9 | 1 | 0 | 0 | 0 |
| 6 | 10 | +02 | -06 | F9 | 0A | 02 | F9 | 1 | 0 | 0 | 0 |
| 6 | 10 | -04 | +10 | F9 | 0A | FC | 0A | 0 | 1 | 1 | 0 |
| 6 | 10 | +06 | -06 | F9 | 0A | 06 | F9 | 1 | 0 | 0 | 0 |
| 6 | 10 | 00 | -06 | F9 | 0A | 00 | F9 | 1 | 0 | 0 | 1 |

Figure 2. Example Operation of an 8-bit Spreader for A=6, B=10

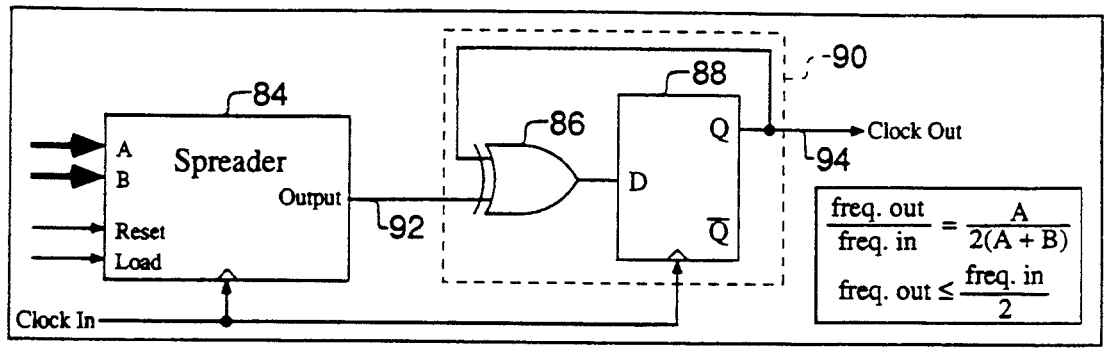
Figure 3a. Rational Number Clock Division
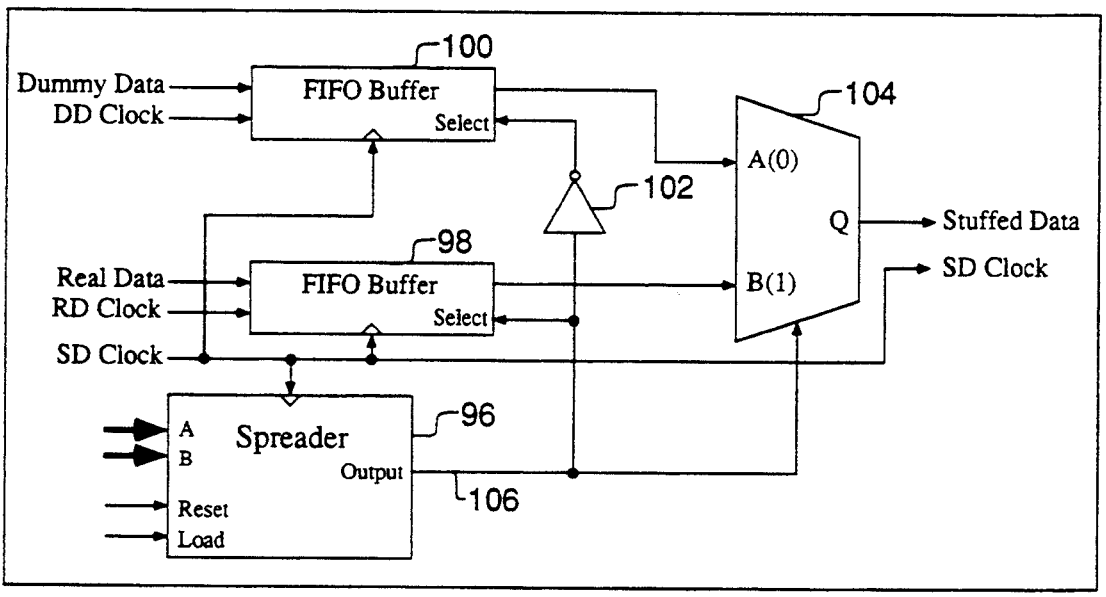
Figure 3b. Data Stuffing
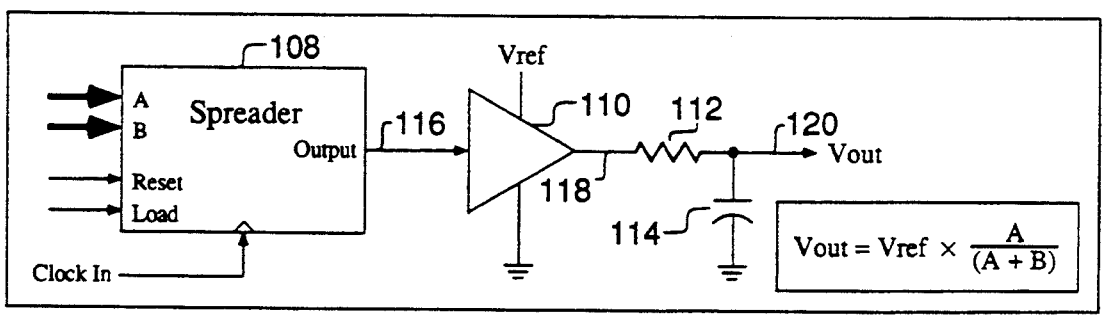
Figure 3c. Precision Voltage Level Generation
Figure 3. Example Applications

SERIAL BINARY PATTERN GENERATOR

BACKGROUND OF THE INVENTION

1. Technical Field

This invention relates to logic circuits, and more particularly to digitally configurable sequential logic circuits for serial bit pattern generation.

2. Discussion

A serial binary pattern generator is a sequential logic circuit which produces a sequence of binary values at its output. The bits which make up the sequence appear at the output of the circuit serially, one bit per cycle of the input clock.

There is a nearly infinite variety of binary sequences which can be produced by sequential logic circuits. One particularly useful kind of sequence is one defined here as "maximally spread." Every finite sequence of bits contains some number of ones and some number of zeros. A maximally spread sequence of bits has the property that if one constructs an infinite sequence by laying copies of the finite sequence end to end along a line in both directions infinitely, all the ones in the infinite sequence are as far apart from each other as possible, and all the zeros in the infinite sequence are as far apart from each other as possible. For example if there are an equal number of ones and zeros in the finite sequence, then the ones and zeros would alternate: "...1010101010..." If there are 3 ones for every 5 zeros in the finite sequence then the maximally spread sequence would be: "...1001001010010010..." No rearrangement of the ones and zeros in such a sequence would separate the ones from each other any better, or separate the zeros from each other any better.

A device is digitally configurable if its operation can be modified by changing the value of one or more digital words presented to the device as control values.

Given these definitions, the present invention is a digitally configurable serial binary pattern generator which produces maximally spread binary sequences at its output. Such a device has a variety of applications. The following paragraphs describe three such applications. They are: clock division by rational numbers, data stuffing, and precision duty cycle generation.

Logic circuits are used in a variety of electronic and computer applications to perform various functions. Typically, each component of a logic circuit requires a clock input to trigger the execution of the component's logic routine. Currently various high rate digital clocks are available. It sometimes becomes necessary or desirable to generate synchronous lower rate clocks by "dividing" an available high rate source clock. This can be accomplished with simple logic if the ratio of the source clock frequency to the desired clock frequency is an even integer, (e.g., dividing a 20 kHz source clock by 4 to produce a desired 5 kHz clock). Division by an even integer is a simple case because a fixed integer number of source clock periods separate successive leading and trailing edges of the desired clock signal. However if the ratio of the source clock frequency to the desired clock frequency is an odd integer or not an integer at all then generation of the desired synchronous, lower frequency clock is more difficult. For the case where the ratio of the source to desired clock frequencies can be expressed as the ratio of two positive integers, the present invention can be combined with simple external circuitry to produce the best all-digital approximation to the desired clock. The clock so produced will have the same average frequency (leading edges per second) as a 50% duty cycle clock of the desired frequency, but its leading and trailing edges will always be coincident with leading edges of the source clock. Such a clock signal is acceptable in most digital circuits and essential in some. Traditionally, the production of such a clock involves the use of analog frequency synthesizers. That approach brings with it all the attendant difficulties in mixing analog and digital circuits especially with respect to synchronization requirements.

In a variety of digital data communication circuits, the allowable input data rate of a device is constrained to be among a small set of rates, e.g., 25, 50, and 100 Mbps. When it is desired to transmit data from a digital source whose rate is not in the allowed set, the source data can be "stuffed" with extraneous data to bring the combined rate up to an allowable rate. For example, a 47 Mbps data source could be stuffed with 3 Mbps of extraneous data to produce a combined data rate of 50 Mbps. Such a scheme is only practical if the extraneous data can later be filtered out. Perhaps the simplest scheme for mixing the two data streams is to send, e.g., 47 "data bits" followed by 3 "stuff bits." However, to minimize the required bandwidth of the circuitry involved, it is desirable to spread out the stuff bits as much as possible within the data bits. For example, send 47 data bits and 3 stuff bits in the following order: 16 data bits, 1 stuff bit, 16 data bits, 1 stuff bit, 15 data bits, 1 stuff bit. The use of a digitally configurable device which could produce such a repeatable, "maximally spread" stuff/data bit pattern for a wide range of stuff-/data rate ratios would give a great deal of flexibility.

It is sometimes desired to produce a binary signal with a known duty cycle. If a duty cycle of M/N is desired, a simple way to accomplish this is to hold an output signal high for M clock cycles and low for N-M clock cycles. If the M clock cycles during which the output is high are spread out as described above among the N-M clock cycles during which the output is low, then the instantaneous deviation of the output signal's duty cycle from the desired duty cycle is minimized. Such a signal could, for example, be applied to a low-pass filter to produce a precision DC voltage equal to M/N times a precision reference voltage. If M and N are digitally programmable then the output from such a circuit will be a digitally programmable precision voltage.

SUMMARY OF THE INVENTION

In accordance with the teachings of the present invention, a digital logic circuit is provided that accepts two parallel control words as configuration inputs, and produces a serial binary data stream as its output. If the two configuration words are denoted "A" and "B" the output stream will contain A ones and B zeros in every (A+B) output bits. Additionally, the ones and zeros will be maximally spread apart. The circuit implementation includes a Load input which allows new configuration values to be latched into the circuit, and a Reset input to force the circuit to a known state. As will appear, the present invention has a wide variety of applications.

BRIEF DESCRIPTION OF THE DRAWINGS

It is convenient in drawings to have a concise way to refer to the present invention. Because the essential feature of the present invention is that it generates maximally spread bit patterns, the abbreviated name for the present invention is "Spreader."

The various advantages of the present invention will become apparent to those skilled in the art after study of the specification and by reference to the drawings in which:

FIG. 1 is a circuit diagram of the invention showing the interconnection of the various components in accordance with the teachings of the preferred embodiment of this invention;

FIG. 2 is a table demonstrating the operation of the circuit of FIG. 1; and

FIGS. 3a through 3c show implementations of several example applications of this invention.

DESCRIPTION OF THE PREFERRED EMBODIMENTS

It should be understood from the outset that the present invention will be described in connection with a few limiting examples which illustrate the best mode of practicing the invention at the time this application was filed. However, various modifications will become apparent to those skilled in the art after having the benefit of studying the text, drawings and claims which follow this detailed specification. With that in mind, the attention of the reader should now be turned to the drawings, especially FIG. 1.

The discussion below uses the term flip-flop to mean a logic device which can sample and hold a single binary value. Sampling of the value at the flip-flop's D input is accomplished on each rising edge of the flip-flop's clock input. This sampling is called "latching." The value held by the flip-flop can only be changed by latching. Changes in the value at the flip-flop's D input are ignored until the next latching. The held value and its inverse are available at the flip-flop's Q and Q-bar outputs respectively. The discussion below uses the term "register" to mean a set of flip-flops clocked by a common clock, and considered to hold a single multi-bit value. There are several multi-wire signal paths (busses) shown in the circuit diagram. The number of flip-flops in each register is equal to the number of wires in each bus. This number is denoted "M".

In accordance with the preferred teachings of this invention, M-bit parallel digital data sources 12 and 14 are provided to be latched into registers 30 and 32 respectively. A Load source 16 and Reset source 18 are also provided. These configuration and control sources would preferably come from a microprocessor or other programmable device, allowing a large degree of flexibility in an application.

During typical operation of the circuit, a pair of control words is latched into the configuration section 20 to configure the circuit. On each rising edge of the clock input, the generator section updates the accumulated value in register I 48 by either adding to it the value held in register B 32 or subtracting from it the value held in register A 30. The decision of whether to add to or subtract from the value I 48 is based on the previous circuit output. The resulting output of the circuit is based on the two's complement arithmetic sign of the resulting value held in register I 48. Auxiliary outputs are also provided which mark significant bits in the output data stream as described below. These outputs are based on the value held in register I 48. Specifically, the timing of the auxiliary outputs relates to detecting when the value held in register I 48 has the M-bit value zero.

With the symbol "A" denoting the value held in register A 30, and the symbol "B" denoting the value held in register B 32, the serial binary data produced at the circuit output, after a Load or Reset, has the following properties: the first output is a one; within every set of (A+B) output bits there are A ones and B zeros; within every set of (A+B) output bits, the ones and zeros are maximally spread apart. Two auxiliary outputs are provided which mark significant bits in the output data stream. A "pattern" in the output data stream is a set of output bits marked at the beginning by a value of one on the "Start of Pattern" output 80, and marked at the end by a value of one on the "End of Pattern" output 82. The length of a pattern is equal to (A+B)/gcd (A,B) where gcd (A,B) denotes the greatest common divisor of A and B. The circuit output at the beginning of a pattern is always a one, and the circuit output at the end of a pattern is always a zero.

The configuration section 20 consists of two registers 30 and 32. The reset section 22 consists of a two-input OR gate 40. The generator section 24 consists of an M-bit 2:1 multiplexer 44, an M-bit full adder 46, and a register 48. The multiplexer 44 has two inputs 36 and 38 derived from the outputs of registers 30 and 32 respectively. Additionally, the multiplexer 44 has a select line 50 to determine which logic function the generator section will perform. The output section 26 consists of a digital inverter 64 and a flip-flop 66. The auxiliary section 28 consists of an M-input AND gate 74 and a flip-flop 76.

The configuration section 20 of the circuit accepts and holds two M-bit parallel control words which configure the pattern desired at the circuit output. The first control word is latched into register A 30, and the second control word is latched into register B 32. Register A 30 and register B 32 each have a clock input 34 to determine when the input control words will be latched. This clock input 34 is derived from the Load source 16. Once these control words are latched they are typically held during the generation of a large number of bits at the circuit output. Register A 30 has a Q-bar output 36, whose value is the one's complement (logical inverse) of the latched value. Register B 32 has a Q output 38, whose value is identical to the latched value.

The function of the generator section is to maintain and update the accumulated value in register I 48, and to provide a carry output 62 which is based sign of the value in register I 48; and an auxiliary output 60 which is the one's complement of the value in register I 48. The generator section accepts three inputs: the M-bit values A-bar (one's complement of the value held in register A 36), B (the value held in register B 38), and the single-bit value derived from the Q-bar output 72 of the output section 26. The M-bit 2:1 multiplexer 44 has a select input 50 derived from the Q-bar output 72 of the output section 26. When the select input 50 is a one, the output 54 is a copy of the input value A-bar 36. When the select input 50 is a zero, output 54 is a copy of the input value B 38. Output 54 of multiplexer 44 is fed to input J of full adder 46.

The combination of multiplexer 44 and M-bit full adder 46 uses two's complement arithmetic to either subtract the value held in register A 30 from, or add the value held in register B 32 to, the accumulated value held in register I 48. Full adder 46 accepts three inputs and produces two outputs. The first input is from line 52, the M-bit value held in register I 48. The second input is from line 54, the M-bit value J produced by multiplexer 44 as described above. The third input is a carry in value 56 derived from the Q-bar output 72 of the output section 26. Full adder 46 performs an "Add with Carry" operation on its inputs producing two outputs. The sum output 58 of the full adder 46 becomes the next value to be held in register I 48. The carry output 62 of the full adder 46 goes to the output section 26 for further processing.

The output section 26 processes the carry output 62 of the full adder 46 to produce the final output 70 of the device. The input 62 to the output section is first inverted by passing through a digital inverter 64. The inverted value 68 is then fed into flip-flop 66. Flip-flop 66 has two outputs: Q 70, the output of the device, and Q-bar 72 which is fed back to the generator section 24 to determine whether the next operation of the generator section will be addition or subtraction.

The auxiliary section 28 provides an in-depth way of monitoring the pattern produced at the circuit output which is useful in certain applications. The output of the circuit is a serial stream of bits repeating a unique data pattern. The pattern is determined by the configuration words latched into the configuration section. It is desirable to have a digital marker for the start and end of this pattern. This auxiliary circuit fulfills this need.

The Start of Pattern output 80 is a one only during the first bit of the unique data pattern. The End of Pattern output 82 is a one only during the last bit of the unique pattern. The AND gate 74 has M inputs from the Q-bar 60 output of register I 48. The output 78 of AND gate 74 is a one whenever the value stored in register I 48 is equal to the M-bit value zero. The "End of Pattern" output 82 is derived from the output 78 of the AND gate 74. The output 78 of the AND gate 74 is also fed into flip-flop 76 which delays it by one clock cycle to produce the "Start of Pattern" output 80. The Start of Pattern output 80 is always a one exactly one clock cycle after the End of a Pattern output 82 is a one.

The reset section 22 provides a means to reset the circuit to a known state; and ensures that when new values are latched into the configuration section, the circuit is reset to the same known state. As implemented in the preferred embodiment, the Load input must be held low whenever the Reset input is pulsed low-high-low. Likewise the Reset input must be held low whenever the Load input is pulsed low-high-low. A Load or Reset forces the circuit output 70 to be zero, the Start of Pattern output 80 to be zero, and the End of Pattern output 82 to be one. On the first clock edge after a Load or Reset the circuit output 70 becomes a one, the Start of Pattern output 80 becomes a one, and the End of Pattern output 82 becomes a zero.

Register I 48 and the flip-flops 66 and 76 are all controlled by a common clock input. On each rising edge of the clock, the value present at the input of each device is "clocked through" to the output of the device. The latched value is held by each device until the next rising edge of the clock. Each device is also controlled by a Reset input which when set high immediately forces the devices to a known state. The Q output of each device is forced to be zero and the Q-bar is forced to the inverse of zero. This inverse is one for the single bit flip-flops 66 and 76, and "all ones" for register I 48. This Reset function allows the circuit to be placed in a known state at any time and especially following a load of new configuration values into the configuration section. This ensures the absence of a time lag between the latching of new configuration values and the proper operation of the circuit based on those values.

FIG. 2 shows a table which details the operation of the circuit of FIG. 1 with the following parameters: Bus width (M)=8, A=6, and B=10. The first row of numbers in the table shows the state of the circuit after a reset. The subsequent rows are the state of the circuit after subsequent clock rising edges, one line per clock cycle.

The left portion of the table shows the effective operation of the circuit in terms of familiar decimal arithmetic. Upon reset, the value I and the circuit output are set to zero. On each clock rising edge, the value of I is updated by adding to it the value labeled Delta in the table. Delta is a mathematical representation of the combination of output 54 of multiplexer 44 and carry-in input 56, and is equal to $-A$ if the current output is a zero and equal to B if the output is a one. The output after any given clock edge is zero if I is greater than or equal to zero and 1 if I is less than zero.

The middle portion of the table shows these same operations in terms of two's complement arithmetic. This is the actual operation of the circuit hardware. In two's complement arithmetic, negative numbers are represented by digital words whose most significant bit is set. In an 8-bit implementation, digital words whose hexadecimal values are between 80 and FF are interpreted as negative numbers. Addition of two's complement numbers is the same as decimal addition, however subtraction of two two's complement numbers U and V is implemented as U+V-bar+1.

The J column plays the same role as the Delta column in the decimal portion of the table. The value of J is selected based on the current output, and the Carry-In column provides the extra 1 for two's complement subtraction when A-bar is selected. The operation of the circuit hardware is always: (new I)=(old I)+J+Carry-In, which adds to and subtracts from I as appropriate. The Carry-Out of this add operation is zero when the resulting value is negative, and one when the resulting value is positive or zero. The Carry-Out signal is used to produce the proper circuit output for each clock cycle. Note that because the Carry-Out value is saved along with the 8 bits of I, the result of the addition is effectively 9 bits wide. This allows an 8-bit implementation for example to work properly for all values of A and B such that $00 <= A <= FF$, $00 <= B <= FF$.

The right portion of the table shows the main and auxiliary outputs of the circuit for each clock cycle. Note that the first output after a reset is a one, the last output in a "pattern" is a zero, and in every 16 cycles there are 6 ones and 10 zeros, maximally spread apart. Also note that the length of the unique portion of the output pattern is 8. The greatest common divisor of A and B (gcd(A,B)) for this case is 2. The pattern length is therefore (A+B)/gcd(A,B)=16/2=8.

FIG. 3 shows several example applications of the present invention. FIG. 3a shows the use of the spreader for rational number clock division. The circuit consists of a spreader 84, an exclusive-OR gate 86, and a flip-flop 88. Exclusive-OR gate 86 and flip-flop 88 combine to form a "toggle flip-flop" 90. Each time the spreader output 92 is a one, the state of the output clock signal 94 will invert. The desire is to spread out these output clock transitions as much as possible while maintaining a specified number of transitions per second. As indicated in the diagram, the frequency of the clock produced by the circuit is related to the source clock frequency by the ratio A/2(A +B).

FIG. 3b shows the application of the spreader to data stuffing. The circuit consists of a spreader 96, two First-In-First-Out (FIFO) buffers 98 and 100, a digital inverter 102, and a 2:1 multiplexer 104. The circuit is configured such that when the spreader output 106 is a one, a "real" data bit is clocked out of its buffer and presented at the output. When the spreader output 106 is a zero, a "dummy" data bit is clocked out of its buffer and presented at the output. Because the ones and zeroes out of the spreader are maximally spread, so also will the real and dummy data be maximally spread. For example, if the real input data rate is 17 kbps and the desired combined stuffed data rate is 25 kbps, then the appropriate configuration values are A=17, B=8.

FIG. 3c shows the application of the spreader to the programmable generation of a precise voltage level. The circuit consists of a spreader 108, a buffer amplifier 110, a resistor 112 and a capacitor 114. The buffer amplifier 110 produces a known voltage level Vref at its output 118 when the output 116 of the spreader is a one, and zero volts at its output 118 when the output 116 of the spreader is a zero. Resistor 112 and capacitor 114 are configured as a low-pass filter to average the resulting waveform 118. The result is that Vout 120 will be a DC voltage level (with a small amount of AC ripple) equal to Vref times the duty cycle of the signal at output 116 of spreader 108. This duty cycle is equal to A/(A+B).

From the foregoing, those skilled in the art should realize that the present invention provides a simple yet flexible way to produce useful serial binary patterns and which further enables the user to change the pattern by simply changing the digital words latched into the configuration section of the device. A large variety of waveforms can be produced if a programmable device, like a microprocessor, is used to configure the device. As noted at the outset, the invention has been described in connection with a few particular examples. However, various modifications and other applications will become apparent to the skilled practitioner after having the benefit of studying the specification, drawings, and the following claims.

What is claimed is:

1. A circuit for generating serial binary patterns, said circuit comprising:
    a first data source means for generating a first digital word having a given binary value A;
    a second data source means for generating a second digital word having a given binary value B; and
    a processing means for producing a continuous serial stream of binary data including A one and B zeros in successive (A+B) bit-length words, wherein said successive (A+B) bit-length words include at least one multi-bit word, and wherein the occurrences of the ones in said multi-bit word are maximally spread apart and the occurrences of the zeros in said multi-bit word are maximally spread apart.

2. The circuit of claim 1 wherein the length of the multi-bit word is equal to ((A+B)/gcd(A,B)), where gcd(A,B) denotes the greatest common divisor of A and B.

3. The circuit of claim 2 wherein processing means further comprises:
    a configuration means for sampling and holding said first and second digital words;
    a generator means for producing a carry output and an auxiliary output as a function of signals applied to first, second, and carry in inputs thereto;
    an output means coupled to the carry output of the generator means.

4. The circuit of claim 3 wherein the configuration means comprises:
    a first register having a D input coupled to the first data source means; and
    a second register having a D input coupled to the second data source means.

5. The circuit of claim 4 wherein said generator means comprises:
    a multiplexer means having a select input, as well as first and second inputs coupled respectively to a Q-bar output of the first register of said configuration means and a Q output of the second register of said configuration means;
    an adder means having a first output and carry output, as well as a first input, a second input, and a carry in input, said first input coupled to the output of said multiplexer means, and said carry output being the carry output of the generator means;
    a third register having an input coupled to the first output of said adder means, a Q output coupled to the second input of said adder means, and a Q-bar output, said output being the auxiliary output of the generator means.

6. The circuit of claim 5 wherein said output means comprises:
    a digital inverter having its input coupled to the carry output of the generator means; and
    a first flip-flop having an input coupled to an output of the digital inverter, and Q and Q-bar outputs, said Q-bar output being coupled to said carry in input of said adder means and to said select input of said multiplexer means, and said Q output being the main output of the circuit.

7. The circuit of claim 6 further comprising:
    logic means for indicating the start and end of each said multi-bit digital word.

8. The circuit of claim 7 wherein said logic means comprises:
    an AND gate having M inputs connected to said auxiliary output of said generator means and providing an output indicated by a value of one the end of each said multi-bit digital word; and
    a second flip-flop coupled to the output of the AND gate and providing an output indicating by a value of one the start of each said multi-bit digital word.

9. The circuit of claim 8 further comprising:
    a clock source means for driving sequential logic components within the processing means;
    a load source means for indicating that the values of the first and second data source means should be sampled to configure the processing means; and
    a reset source means for indicating that the processing means should be reset to begin a new multi-bit word.

10. The circuit of claim 9 further comprising:
    a reset means for forcing said generator means to start a new multi-bit digital word when either:
    1) a rising edge on a signal produced by the load source means occurs indicating new configuration values should be sampled from first and second data source means, or 2) a rising edge on a signal produced by the reset source means occurs indicating that the processing means should be reset.

11. The circuit of claim 10 wherein reset means comprises:
an OR gate whose inputs are coupled to the load source means and the reset source means, and an output.

12. The circuit of claim 11 wherein the load source means is coupled to the clock inputs of the first and second registers of said configuration means.

13. The circuit of claim 12 wherein the third register and first and second flip-flops all:
have clock inputs coupled to the clock source means; and
have asynchronous reset inputs coupled to the output of the reset means.

14. A method for generating binary patterns, said method comprising:
a) generating a first non-negative integer having a given binary value A;
b) generating a second non-negative integer having a given binary value B; and
c) producing an output that is a continuous stream of binary data including A ones and B zeros in successive (A+B) bit-length words, wherein each successive (A+B) bit-length words include at least one multi-bit word, and wherein the occurrences of the ones in said multi-bit word are maximally spread apart and the occurrences of the zeros in said multi-bit word are maximally spread apart.

15. The method of claim 14 wherein the length of the multi-bit word is equal to ((A+B)/gcd(A,B)), where gcd(A,B) denotes the greatest common divisor of A and B.

16. The method of claim 15 wherein an accumulator is provided and updated once for each bit produced.

17. The method of claim 16 wherein the accumulator and the output are first initialized to zero.

18. The method of claim 11 generating each successive bit in the multi-bit word, which further includes:
a) determining if the current output value is a 1, in which case the value held in the accumulator is augmented by the value B;
b) determining if the current output value is a 0, in which case the value held in the accumulator is diminished by the value A;
c) determining if the new value held by the accumulator is negative, in which case the new output is a 1, otherwise the new output is a 0.

19. The method of claim 18 wherein steps a), b), and c) are repeated indefinitely, producing repetitions of the multi-bit word.

20. The method of claim 19 wherein the accumulator and the output can be forced at any time to have the value 0, creating the beginning of a new multi-bit word.

21. The method of claim 20 where processing can be monitored by two auxiliary outputs wherein:
an "End of Pattern" output is a 1 if and only if the value held in the accumulator is a 0; and
a "Start of Pattern" output is always equal to the value of the "End of Pattern" output associated with the previous bit.

* * * * *